(12) United States Patent
Inanami

(10) Patent No.: US 6,756,159 B2
(45) Date of Patent: Jun. 29, 2004

(54) METHOD OF PREPARING EXPOSURE DATA AND METHOD OF PREPARING APERTURE MASK DATA

(75) Inventor: Ryoichi Inanami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 10/107,042

(22) Filed: Mar. 28, 2002

(65) Prior Publication Data

US 2002/0142238 A1 Oct. 3, 2002

(30) Foreign Application Priority Data

Mar. 28, 2001 (JP) ........................................ 2001-093667

(51) Int. Cl.[7] .............................. G03F 9/00; G06F 17/50
(52) U.S. Cl. ........................... 430/5; 430/296; 430/942; 716/19; 716/21
(58) Field of Search .............................. 430/5, 30, 296, 430/942; 716/19, 21

(56) References Cited

U.S. PATENT DOCUMENTS 6,481,004 B2 * 11/2002 Inanami et al. ............... 716/21

OTHER PUBLICATIONS

Inanami, R., et al., "Exposure Pattern Data Generation Apparatus Associated With Standard Cell Library and Charged Beam Exposure", U.S. application Ser. No. 09/817,270, filed on Mar. 27, 2001.

Inanami, R., et al., "Circuit Pattern Design Method, Exposure Method, Charged–Particle Beam Exposure System", U.S. application Ser. No. 09/878,286, filed Jun. 12, 2001.

* cited by examiner

Primary Examiner—Christopher G. Young
(74) Attorney, Agent, or Firm—Finnegan, Henderson, Farabow, Garrett & Dunner, L.L.P.

(57) ABSTRACT

There is disclosed a manufacturing method of a semiconductor device comprising extracting characters from each layer defined in a standard cell for use in a circuit pattern of the semiconductor device designed by using standard cells, designing a pattern layout of an aperture mask in which character apertures having an aperture shape corresponding to an extracted character shape are arranged in a plurality of aperture blocks able to be irradiated with charged particle beam by deflection, and generating one piece of exposure data in which position information of the character apertures in the aperture blocks, and an irradiation position of a sample with the charged particle beam shaped by the character apertures are recorded and which is common to a plurality of layers defined in the standard cell based on the designed pattern layout.

4 Claims, 5 Drawing Sheets

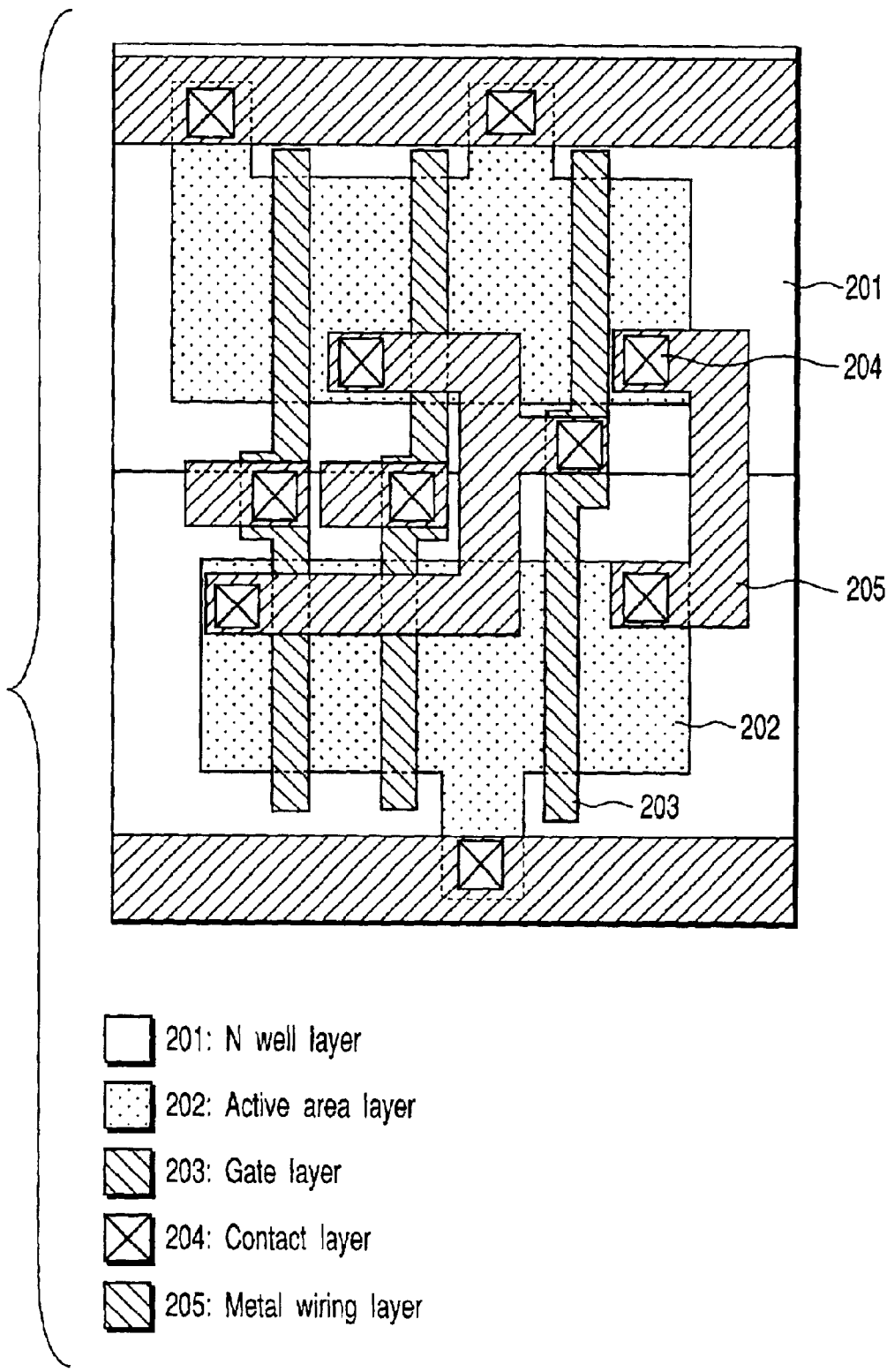
□ 201: N well layer
⋯ 202: Active area layer
▨ 203: Gate layer
⊠ 204: Contact layer
▨ 205: Metal wiring layer
F I G. 2

METHOD OF PREPARING EXPOSURE DATA AND METHOD OF PREPARING APERTURE MASK DATA

CROSS-REFERENCE TO RELATED APPLICATIONS

This application is based upon and claims the benefit of priority from the prior Japanese Patent Application No. 2001-093667, filed Mar. 28, 2001, the entire contents of which are incorporated herein by reference.

BACKGROUND OF THE INVENTION

1. Field of the Invention

The present invention relates to a manufacturing method of a semiconductor device for exposing a circuit pattern of the semiconductor device in a character projection system, a charged particle beam exposure apparatus of the character projection system, an aperture mask data preparing method for use in exposing respective layers of the circuit pattern using the exposure apparatus and an exposure data preparing method.

2. Description of the Related Art

When a resist pattern of a semiconductor device is prepared by electron beam (EB) exposure, it is necessary to convert data for each layer of a device pattern for each step of preparing the device, and to prepare exposure data having a data form able to be inputted into an exposure apparatus.

A shape of the pattern formed on a resist differs with respective layers. Therefore, when exposure data for each layer is prepared, and the pattern of the corresponding layer is exposed, the corresponding exposure data is inputted to an exposure control apparatus or the exposure apparatus.

The following problems occur in the conventional method.

Since data conversion is repeated for each layer of the pattern to be exposed, the data conversion has to be performed for all the layers. For example, since even one layer requires a conversion time of several hours, the time required for the data conversion of all the layers becomes very long, and the conversion is frequently unfinished in one day.

It is necessary to prepare the exposure data for the number of layers of the pattern to be exposed, and storage apparatuses such as a very large hard disk drive are required in a computer for the data conversion. For example, the exposure data requires a disk space of about 100 megabytes (MB) or more even in one layer. When ten layers in total are exposed, a capacity well over a gigabyte is required.

BRIEF SUMMARY OF THE INVENTION (1) According to one aspect of the present invention, there is provided a manufacturing method of a semiconductor device in which a circuit pattern of each layer of the semiconductor device designed by using standard cells is exposed by a character projection system, the method comprising: allocating one aperture block to each layer defined in standard cells, and setting an aperture mask in which only character apertures corresponding to a character shape extracted from the associated layer are arranged in an exposure apparatus in each aperture block; moving the aperture mask in such a manner that the associated aperture block can be irradiated with charged particle beam during exposure of an optional layer; and shaping the charged particle beam by the character apertures arranged in one aperture block, and exposing a circuit pattern of one layer.

(2) According to another aspect of the present invention, there is provided a charged particle beam exposure apparatus comprising: an aperture mask in which character apertures having an aperture shape corresponding to a character shape extracted from each layer defined in a standard cell for use in a semiconductor device designed are arranged in order to irradiate a sample with charged particle beam shaped by the character apertures, wherein aperture blocks as regions able to be irradiated with the charged particle beam by deflection are associated with respective layers defined in the standard cell and set in the aperture mask, and only the character apertures corresponding to the character shape extracted from the associated layer are arranged in each aperture block.

(3) According to another aspect of the present invention, there is provided a preparing method of aperture mask data comprising: extracting a pattern of each layer defined in a standard cell for use in a semiconductor device designed by using standard cells as a character; associating an aperture block as a region able to be irradiated with charged particle beam by deflection with each layer defined in the standard cell and setting the aperture block in the aperture mask; and arranging character apertures having an aperture shape corresponding to a character shape extracted from the associated layer in each aperture block.

(4) According to another aspect of the present invention, there is provided an exposure data preparing method comprising: extracting a pattern of each layer defined in a standard cell for use in a semiconductor device designed by using standard cells as a character; designing a pattern layout of an aperture mask in which character apertures corresponding to the extracted characters are arranged in a plurality of aperture blocks able to be irradiated with charged particle beam by deflection; and generating one piece of exposure data in which position information of the character apertures in the aperture blocks, and an irradiation position of a sample with the charged particle beam shaped by the character apertures are recorded and which is common to the plurality of layers defined in the standard cell based on the layout of the designed aperture mask.

(5) According to another aspect of the present invention, there is provided a manufacturing method of a semiconductor apparatus using a charged particle beam exposure apparatus in which a character is extracted from a pattern of each layer of a circuit pattern of a semiconductor device, which comprises an aperture mask with character apertures having an aperture shape corresponding to an extracted character shape arranged therein, and in which a sample is irradiated with charged particle beam shaped by the character apertures, the method comprising: associating the aperture block as a region which can be irradiated with the charged particle beam by deflection with each layer defined in a standard cell and setting the aperture block in the aperture mask; arranging only the character apertures corresponding to the character shape extracted from the associated layer in the aperture block; moving the aperture mask in such a manner that the associated aperture block can be irradiated with the charged particle beam during exposure of the optional layer; and shaping the charged particle beam by the character apertures arranged in the aperture block during the exposure.

BRIEF DESCRIPTION OF THE SEVERAL VIEWS OF THE DRAWING

FIG. 2 is a diagram showing a pattern layout of a 2-inputs AND cell according to one embodiment of the present invention.

DETAILED DESCRIPTION OF THE INVENTION

An embodiment of the present invention will be described hereinafter with reference to the drawings.

A method of using electron beam (EB) exposure of a character projection (CP) system in a manufacturing step, and reducing the number of character apertures required for transferring a circuit pattern of a logic device (semiconductor device) by design of a standard cell system is disclosed in U.S. Pat. Appln. Ser. No. 09/878,286 filed by the present inventor, the entire contents of this reference being incorporated herein by reference.

Figure 1:
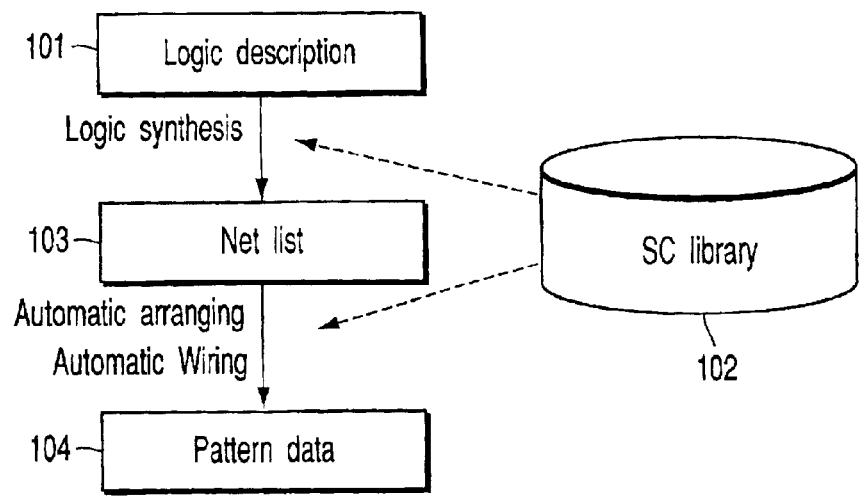
FIG. 1 is a diagram showing an outline of a generating method of a circuit pattern by a standard cell based design according to one embodiment of the present invention.

As shown in FIG. 1, the method comprises: a net list 103 corresponding to a logic description 101 is generated by synthesizing standard cells in a standard cell (SC) library 102. The SC library 102 store a plurality of standard cells with functions allocated thereto. The logic description 101 describes operations and functions of a logic device. Subsequently, the method comprises: removing a standard cell having a small reduction effect of the number of shots in the prepared net list 103 from the SC library 102; and preparing the net list. Subsequently, the method comprises: obtaining a pattern of each layer defined in the standard cell for use in the finally prepared net list as a character which is a unit to be exposed in a CP system; and preparing pattern data 104 of each layer by automatic placement and routing (P&R).

With the use of this design method, as many kinds as possible of SCs for use in the pattern data are reduced, and the number of SCs is reduced to such an extent that the SCs can be arranged in one aperture block of an aperture mask. Therefore, the whole logic pattern of a certain layer can be exposed by the CP system without moving the aperture block.

Then, in the present embodiment, an arranging method of characters into the CP aperture mask will be described based on the pattern data of a logic device (ASIC product) prepared by this method. In fabricating the device pattern, a certain layer can be exposed only via the character apertures arranged in one aperture block.

By the above-described design method, device patterns all of which can be exposed by 399 kinds of characters per layer can be prepared in the logic device in which a resist pattern is formed by electron beam exposure of a character projection system. The formation of the characters in the standard cell and the arranging method of the characters into the CP aperture mask will be described by way of an example of a 2-inputs AND cell among the standard cells included in the SC library.

The 2-inputs AND cell is defined by a pattern layout shown in FIG. 2 in the SC library. For the 2-inputs AND cell, as shown in FIG. 2, patterns of the respective layers such as an N well layer 201, active area (AA) layer 202, gate layer 203, contact layer 204, and metal wiring layer 205 are defined.

In the SC library of a technology for use herein, the standard cell has a size (outer-shape size) of 3.2 $\mu$m×4.8 $\mu$m. When one character aperture is assumed to have a maximum size of 5 $\mu$m square, the pattern defined in each layer of the cell is used as one character aperture, and can be exposed by one EB shot.

Figure 3:
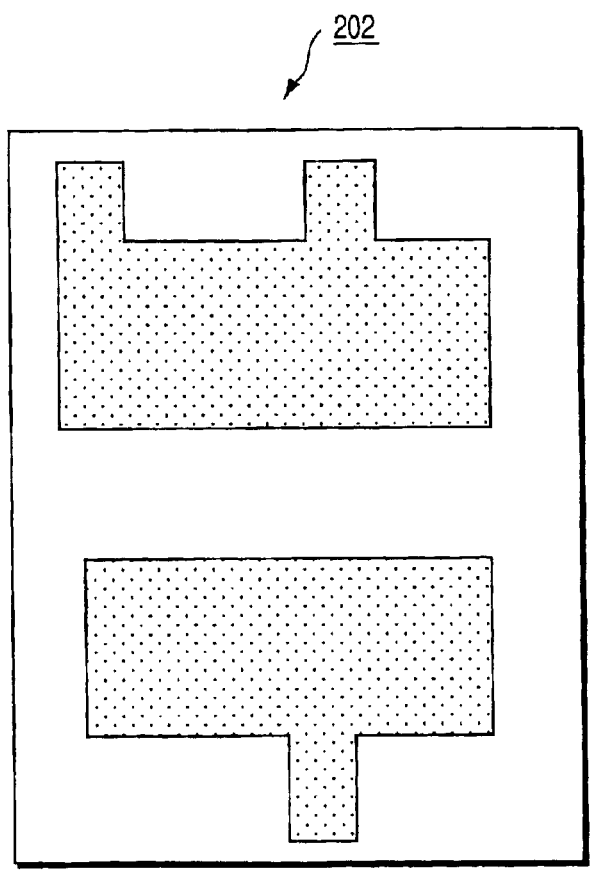
FIG. 3 is a diagram showing a pattern of an active area layer of the 2-inputs AND cell shown in FIG. 2.
Figure 4:
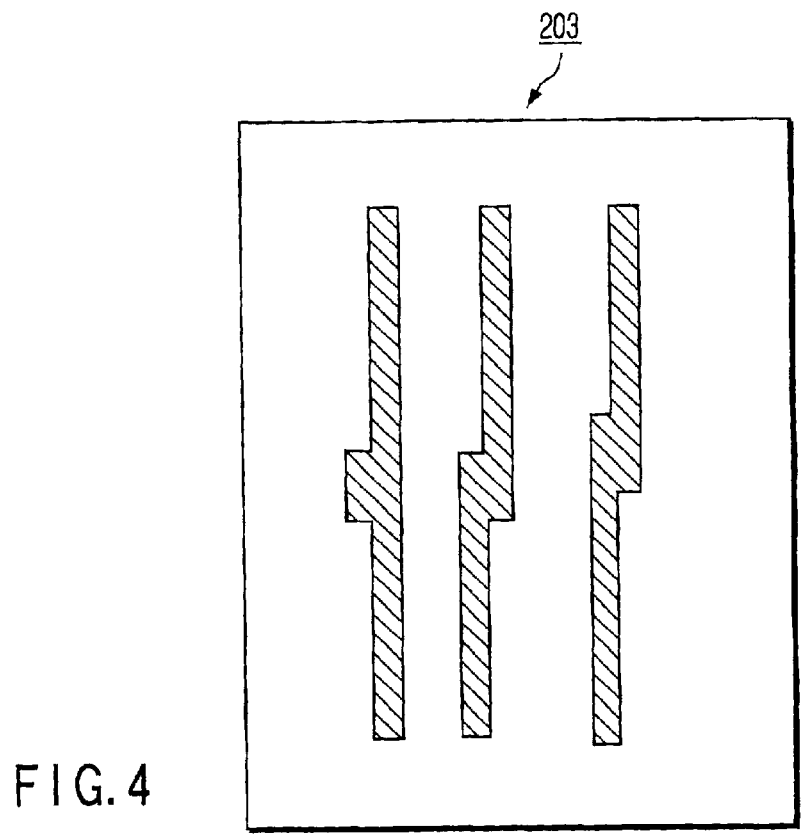
FIG. 4 is a diagram showing the pattern of a gate layer of the 2-inputs AND cell shown in FIG. 2.
Figure 5:
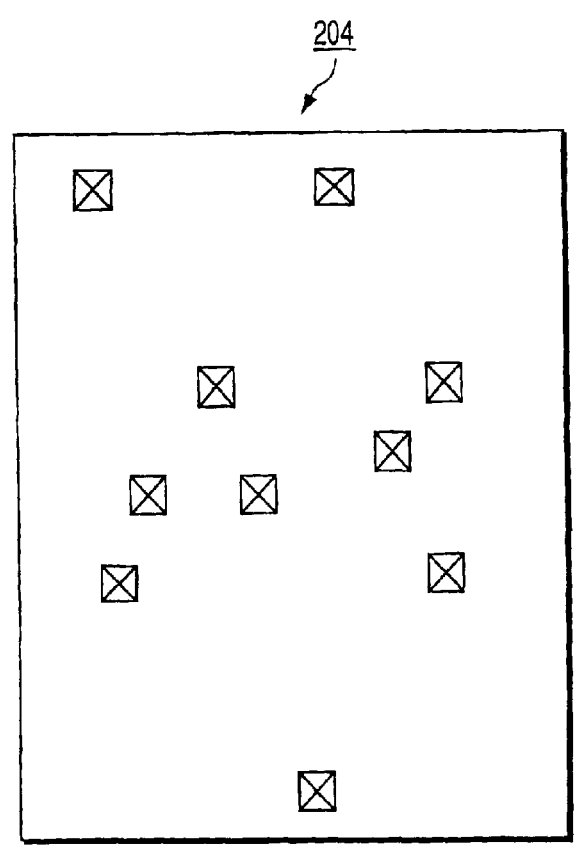
FIG. 5 is a diagram showing the pattern of a contact layer of the 2-inputs AND cell shown in FIG. 2.
Figure 6:
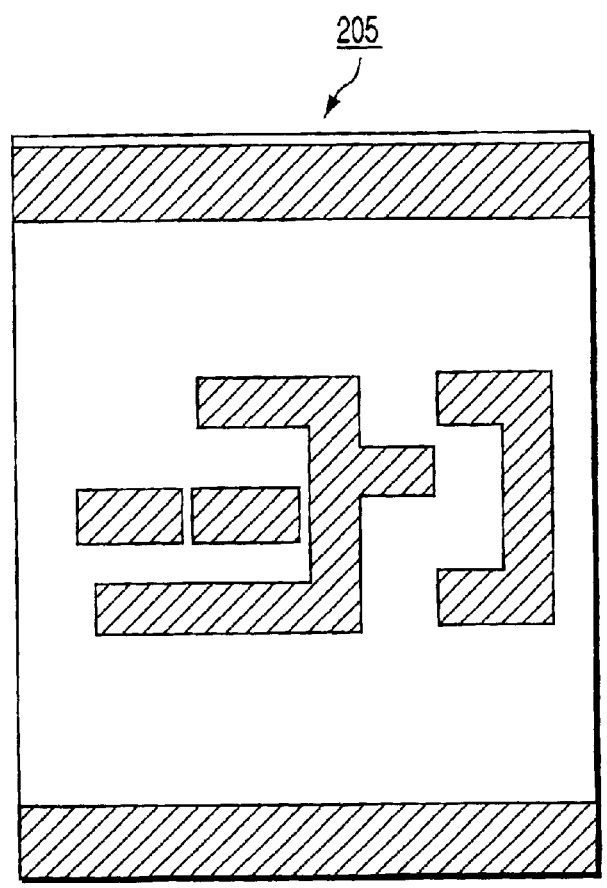
FIG. 6 is a diagram showing the pattern of a metal wiring layer of the 2-inputs AND cell shown in FIG. 2.

When electron exposure is assumed to be adopted to expose four layers including the active area layer 202, gate layer 203, contact layer 204, and metal wiring layer 205 among the layers shown in FIG. 2, it is necessary to prepare four character apertures for the exposure of the cell. That is, the character apertures having shapes shown in FIGS. 3 to 6 are prepared on the CP aperture mask. FIG. 3 is a plan view showing the pattern of the character apertures of the active area layer of the 2-inputs AND cell. FIG. 4 is a plan view showing the pattern of the character apertures of the gate layer of the 2-inputs AND cell. FIG. 5 is a plan view showing the pattern of the character apertures of the contact layer of the 2-inputs AND cell. FIG. 6 is a plan view showing the pattern of the character apertures of the metal wiring layer of the 2-inputs AND cell.

Here, when the number of characters able to be arranged in one aperture block is 400 in an electron beam exposure apparatus, all the patterns can be exposed with 399 kinds of characters per layer, and it is therefore possible to arrange all character apertures for use in exposure of one layer in one aperture block.

Then, one layer is allocated to one aperture block. The character apertures of each layer of the standard cell are distributed and arranged into each aperture block to which the layer is allocated. As a result, the character apertures necessary during the exposure of the optional layer are contained in one aperture block.

The character apertures of the optional layer of the standard cell are distributed into the allocated aperture block. Thereby, during the exposure of the pattern of the optional layer of the semiconductor device, all the character apertures can be selected without moving the aperture block, and a maximum exposure throughput can be obtained. Moreover, in an interval between exposures of two layers, the CP aperture mask is moved, and the aperture block corresponding to the layer to be exposed next is set in a selectable state by a character selection deflector, so that the throughput is not deteriorated.

Figure 7:
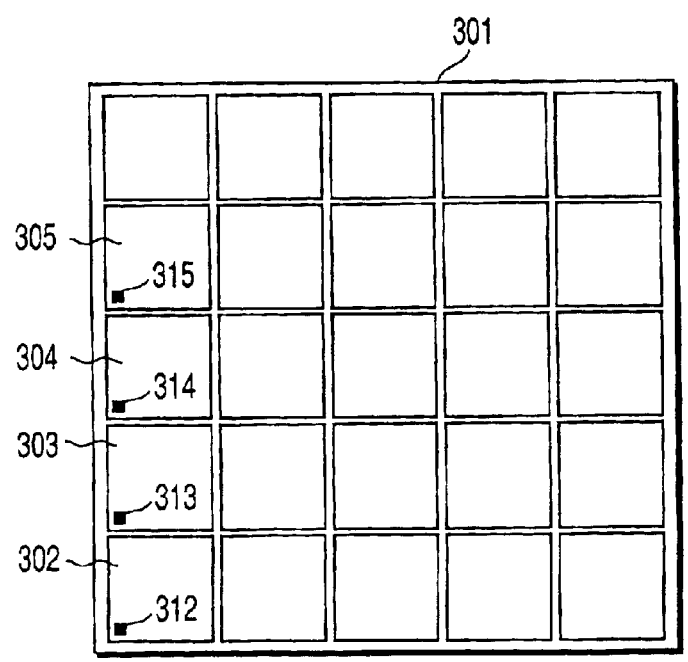
FIG. 7 is a diagram showing a schematic constitution of an aperture mask according to one embodiment of the present invention.

Furthermore, the arrangement of the respective characters into the aperture block is shown in FIG. 7. In a character mask 301, an AA layer aperture block 302, gate layer aperture block 303, contact layer aperture block 304, and metal wiring layer aperture block 305 are arranged. Moreover, character apertures 312 to 315 corresponding to the patterns of the respective layers of the 2-inputs AND cell are formed in the AA layer aperture block 302, gate layer aperture block 303, contact layer aperture block 304, and metal wiring layer aperture block 305.

The character apertures 312 to 315 corresponding to the patterns of the respective layers of the 2-inputs AND cell are arranged in the same position in the respective aperture blocks 302 to 305. Thereby, during the exposure of the patterns of the respective layers, a deflection signal to be inputted into the character selection deflector may be the same in any layer. This indicates that the kind of the character to be exposed in the CP system described in exposure data, and irradiation position on a sample to be exposed with the character beam may be the same in any layer.

Figure 8:
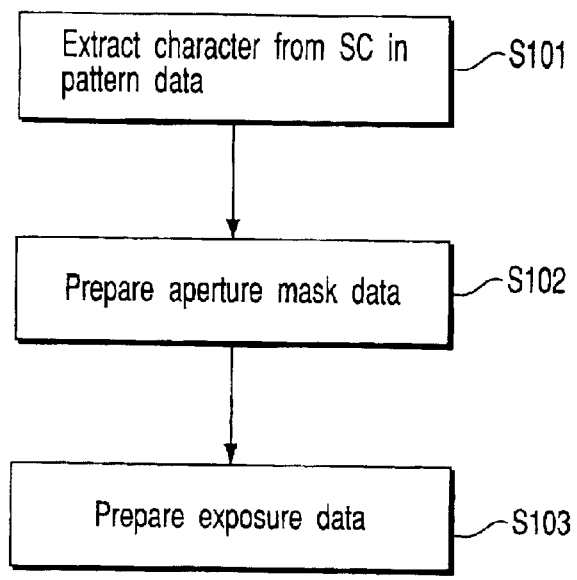
FIG. 8 is a flowchart showing a step of preparing exposure data and the aperture mask from pattern data according to one embodiment of the present invention.

A step of using the above-described method to prepare the exposure data and aperture mask from the pattern data will be described with reference to FIG. 8.

First, characters are extracted from the data of each layer defined in the SC in the prepared pattern data (step S101).

Subsequently, since an electron beam is formed into an extracted character shape, the character apertures having an aperture shape corresponding to the character shape design the data of the aperture mask in which the character apertures are arranged (step S102). Here, a plurality of aperture blocks as regions which can be irradiated by the deflection of the electron beam as described later are arranged in the aperture mask. Moreover, each layer to be exposed is allocated to each aperture block. That is, the respective character apertures arranged in one aperture block are used only in the exposure of one layer. An aperture mask data which character apertures are relatively disposed in the same position among aperture blocks associated with respective layers to the same standard cell.

Subsequently, the exposure data in which position information of the standard cell disposed in the aperture block and the positions to be exposed onto the sample are recorded are prepared (step S103). Since the respective character apertures for exposing the patterns of the respective layers of the same standard cell are disposed in relatively the same position in the respective aperture blocks, it is unnecessary to prepare the exposure data for each layer. One piece of exposure data common to the respective layers defined in the standard cell may be generated.

Subsequently, one piece of exposure data common to the respective layers is used to expose the respective layers. During the exposure, only the character apertures for use in the exposure of one layer are formed in each aperture block. Therefore, it is unnecessary to move the aperture block, when the optional layer is formed.

Figure 9:
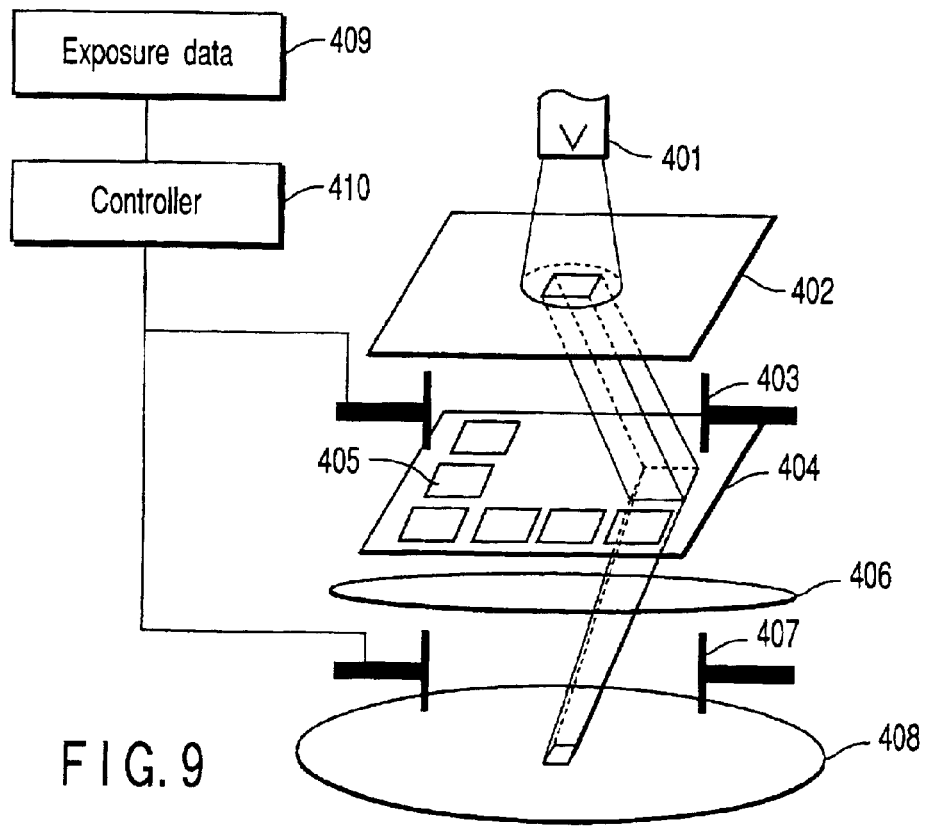
FIG. 9 is a diagram showing the schematic constitution of an electron beam exposure apparatus according to one embodiment of the present invention.

As shown in FIG. 9, a controller 410 uses common exposure data 409 to control a character selection deflector 403 and objective deflector 407 and to deflect the electron beam emitted from an electron gun 401. Character apertures 405 are selected and the irradiation position onto a sample 408 is changed, so that a plurality of layers can be exposed. Additionally, in FIG. 9, a reference numeral 402 denotes a shaped aperture, 404 denotes an aperture block, and 406 denotes a reduction lens.

As described above, for the layer whose pattern is defined in the SC library, the exposure data of the respective layers can be used in common. Usually, the layer defined in the standard cell corresponds to a front end of line (FEOL) step of manufacturing an MOS transistor portion.

Thereby, the frequency of data conversion can be reduced, and therefore the time required for the data conversion can be reduced. Moreover, since it is unnecessary to prepare separate exposure data for each layer, pressurizing of a disk space of a computer by the exposure data can be relaxed. Furthermore, since it is unnecessary to select data as an exposure object from a plurality of pieces of exposure data corresponding to a plurality of layers, artificial mistakes such as use of a wrong exposure pattern can be reduced.

Additionally, in the above-described embodiment, the electron beam exposure has been used, but the present invention can be applied to the exposures using the charged particle beam, such as an ion beam exposure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A preparing method of aperture mask data comprising:
   extracting patterns of respective layers defined in a standard cell for use in a semiconductor device designed by using standard cells as characters;
   associating aperture blocks as regions able to be irradiated with charged particle beam by deflection with the respective layers defined in said standard cell and setting the aperture blocks in an aperture mask; and
   arranging character apertures having an aperture shape corresponding to a character shape extracted from the associated layer in said respective aperture blocks.

2. The preparing method of the aperture mask data according to claim 1, wherein the respective character apertures corresponding to the characters of the respective layers extracted from the same standard cell are arranged in relatively the same position of the respective aperture blocks.

3. An exposure data preparing method comprising:
   extracting patterns of respective layers defined in a standard cell for use in a semiconductor device designed by using standard cells as characters;
   designing a pattern layout of an aperture mask in which character apertures corresponding to the extracted characters are arranged in a plurality of aperture blocks able to be irradiated with charged particle beam by deflection; and
   generating one piece of exposure data in which position information of the character apertures in said aperture blocks, and an irradiation position of a sample with the charged particle beam shaped by the character apertures are recorded and which is common to a plurality of layers defined in said standard cell based on the layout of the designed aperture mask.

4. The exposure data preparing method according to claim 3, wherein the designing of the pattern layout of the aperture mask comprises:
   allocating one aperture block to each layer defined in said standard cell; and
   arranging the character apertures corresponding to patterns of the respective layers of the same standard cell in relatively the same position of each aperture block to which one layer is allocated.

* * * * *